(12) United States Patent
Arisumi et al.

(10) Patent No.: US 7,618,876 B2
(45) Date of Patent: Nov. 17, 2009

(54) SEMICONDUCTOR DEVICE AND METHOD OF MANUFACTURING THE SAME BY FILLING A TRENCH WHICH INCLUDES AN ADDITIONAL COATING STEP

(75) Inventors: Osamu Arisumi, Yokohama (JP);
Masahiro Kiyotoshi, Sagamihara (JP);
Katsuhiko Hieda, Yokohama (JP);
Yoshitaka Tsunashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 312 days.

(21) Appl. No.: 11/227,252

(22) Filed: Sep. 16, 2005

(65) Prior Publication Data
US 2006/0270170 A1    Nov. 30, 2006

(30) Foreign Application Priority Data
May 27, 2005    (JP)    ............................. 2005-155806

(51) Int. Cl.
*H01L 21/76*    (2006.01)
*H01L 21/44*    (2006.01)

(52) U.S. Cl. ............... 438/435; 438/653; 257/E21.682; 257/E21.546; 257/E21.548

(58) Field of Classification Search ................. 438/435, 438/653; 257/E21.682, E21.546, E21, 548
See application file for complete search history.

(56) References Cited

U.S. PATENT DOCUMENTS 6,309,928 B1 * 10/2001 Sung et al. .................. 438/265
6,391,781 B1   5/2002 Ozawa et al.
6,479,405 B2  11/2002 Lee et al.
6,656,817 B2 * 12/2003 Divakaruni et al. ......... 438/435
2004/0072429 A1  4/2004 Hieda et al.
2005/0170608 A1 * 8/2005 Kiyotoshi et al. ........... 438/427

FOREIGN PATENT DOCUMENTS

JP    60-124839    7/1985

(Continued)

OTHER PUBLICATIONS

Notification of Reasons for Rejection issued by the Japanese Patent Office on Apr. 8, 2008, for Japanese Patent Application No. 2005-155806, and English-language translation thereof.

(Continued)

*Primary Examiner*—Walter L Lindsay, Jr.
*Assistant Examiner*—Ron E Pompey
(74) *Attorney, Agent, or Firm*—Finnegan, Henderson, Farabow, Garrett & Dunner, L.L.P.

(57) ABSTRACT

A method of manufacturing a semiconductor device comprises forming a trench in a semiconductor substrate, forming a first insulating film having a first recessed portion in the trench, forming a coating film so as to fill the first recessed portion therewith, transforming the coating film into a second insulating film, planarizing the second insulating film to expose the first insulating film and the second insulating film, removing at least the second insulating film from the first recessed portion to moderate an aspect ratio for the first recessed portion formed in the trench, thereby forming a second recessed portion therein, and forming a third insulating film on a surface of the semiconductor substrate so as to fill the second recessed portion therewith.

6 Claims, 5 Drawing Sheets

FOREIGN PATENT DOCUMENTS

| | | |
|---|---|---|
| JP | 10-242264 | 9/1998 |
| JP | 10-308442 | 11/1998 |
| JP | 2001-35914 | 2/2001 |
| JP | 3178412 | 4/2001 |
| JP | 2002-208629 | 7/2002 |

OTHER PUBLICATIONS

Notification of Reasons for Rejection mailed by the Japanese Patent Office on Aug. 5, 2008, in counterpart Japanese Patent Application No. 2005-155806, and English-language translation thereof.

* cited by examiner

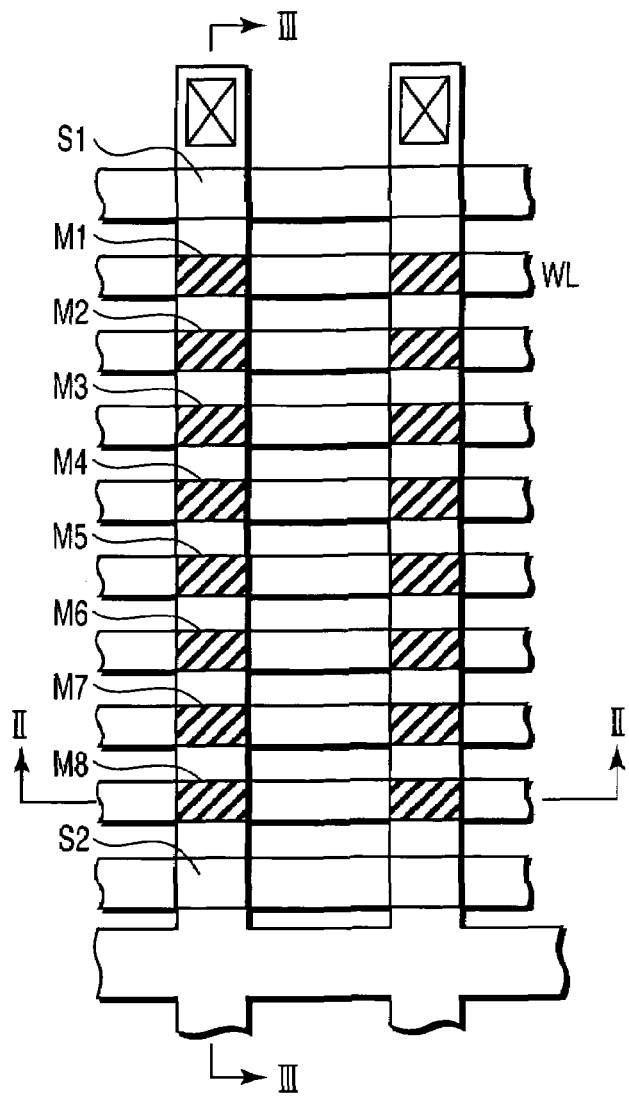
F I G. 1
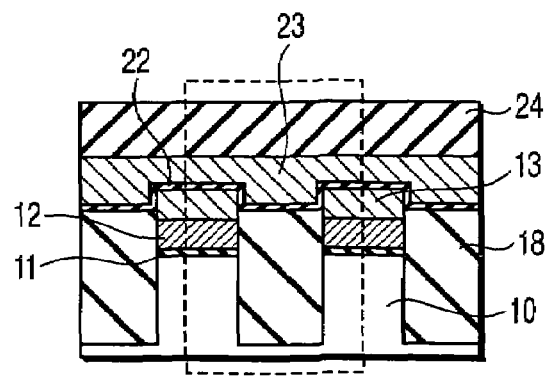
F I G. 2

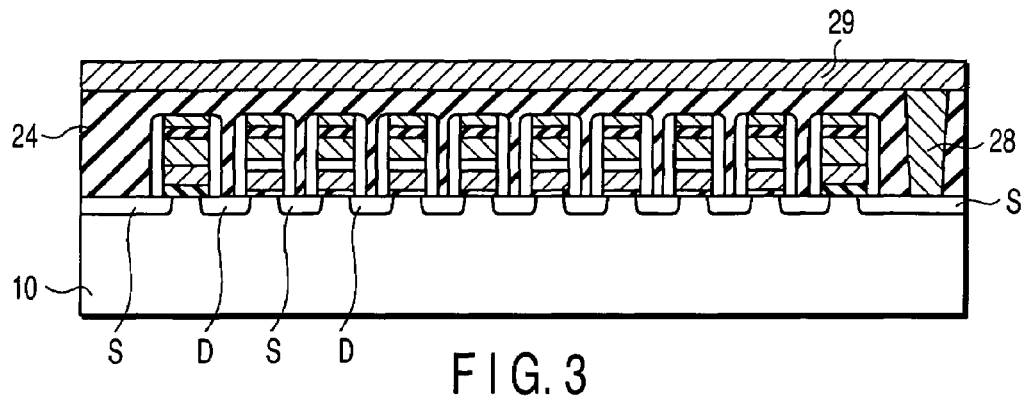
F I G. 3
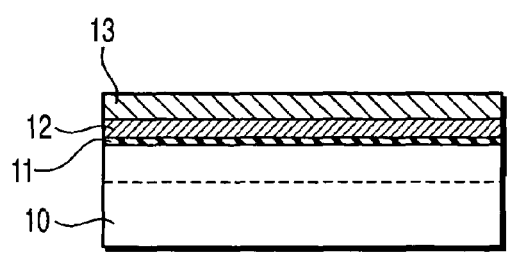
F I G. 4A
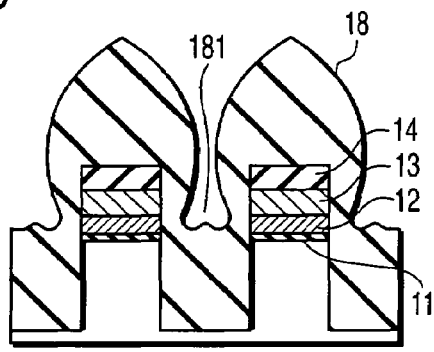
F I G. 4D
F I G. 4B
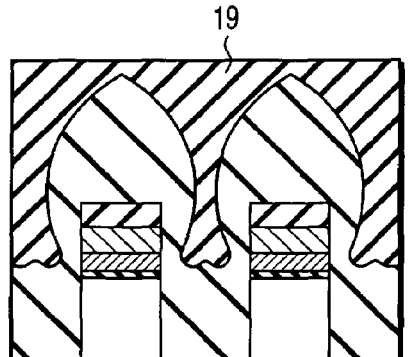
F I G. 4E
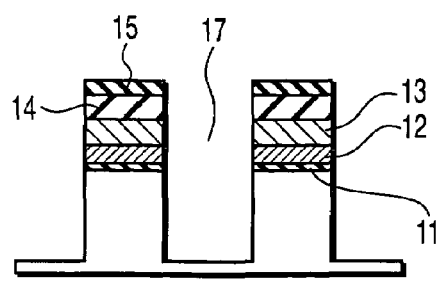
F I G. 4C
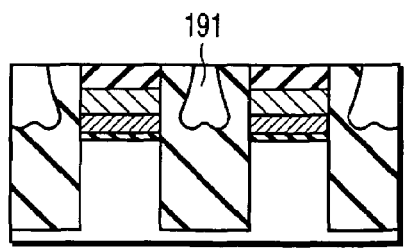
F I G. 4F

SEMICONDUCTOR DEVICE AND METHOD OF MANUFACTURING THE SAME BY FILLING A TRENCH WHICH INCLUDES AN ADDITIONAL COATING STEP

CROSS-REFERENCE TO RELATED APPLICATIONS

This application is based upon and claims the benefit of priority from prior Japanese Patent Application No. 2005-155806, filed May 27, 2005, the entire contents of which are incorporated herein by reference.

BACKGROUND OF THE INVENTION

1. Field of the Invention

The present invention relates to a semiconductor device and a method of manufacturing the same and, in particularly, to an STI structure having a preferable surface shape and a method of manufacturing the same.

2. Description of the Related Art

An element isolation technique is known as one of the important techniques to achieve a high integration density of an LSI. In the isolation technique, a shallow trench isolation (STI) structure is mainly used. However, although, at the present, a ratio of a trench width to a trench depth (aspect ratio) increases, STI filling cannot be easily performed without forming a void or a seam in a TEOS/$O_3$ film obtained by a conventional normal-pressure CVD method, an HDP-TEOS film obtained by a plasma CVD method, or the like. Especially, in the STI filling of an NAND flash memory, a silicon oxide film must be filled in the form of a high aspect and taperless STI shape as compared to a logic device. For this reason, it is difficult from 90-70-nm-width generation that a high density plasma (HDP) single-layer oxide film, which does not pose any problem in 130-nm-width generation, is once filled in the STI structure.

As a countermeasure against the above problem, an STI filling technique using a coating film has been developed. For example, after an HDP film is formed in a trench having a depth of 350 to 450 nm from a floating gate surface to an STI bottom, a coating film of a perhydro-silazane polymer (Polysilazane to be referred as PSZ hereinafter) solution is formed and etched back by devising wet etching, so that a level of STI filling may be controlled.

However, in a trench having a narrow STI width, a wet etching rate of the PSZ film is considerably higher than that of the HDP film. In particular, when an etching solution containing hydrogen fluoride is used for the STI structure having a width of about 90 nm, a large etching rate difference of 2.5 times or more is generated. Therefore, the PSZ film is mainly etched, and the HDP film filled in the STI trench of the semiconductor substrate is thinly left on a side surface of a floating gate (FG) formed through a tunnel insulating film, or the HDP film is partially left in the shape of a taper on the side surface of the floating gate.

Depression of the STI filling material surface is caused by the etching rate difference because the PSZ film is not sufficiently transformed into $SiO_2$. In order to decrease the etching rate of the PSZ film in the step of densifying the $SiO_2$ film, a method of planarizing and then densifying the $SiO_2$ film is proposed. However, even in this method, when the STI trench width is about 100 nm or less, oxygen ($O_2$) required to sufficiently transform the PSZ film into the $SiO_2$ film is not deeply supplied to the STI trench, and the situation of wet etching controllability is still difficult.

In order to secure the drivability of the control gate on the floating gate side surface, an improved shape (tapered shape having a thin HDP film) is very difficult to be formed in a wafer plane or between wafer planes with good controllability. For this reason, even though a control gate (CG) is formed on the floating gate and the filled HDP film through an ONO film and an interlayer insulating film is formed on the control gate, a ratio (coupling ratio) of a coupling capacitance C2 between the floating gate (FG) and the control gate (CG) and a coupling capacitance C1 between the floating gate (FG) and the substrate may fluctuate to cause a decrease in yield.

Furthermore, when a fine device structure advances, the STI filled surface depressed in a concave shape is close to the level of a tunnel oxide film to cause deterioration of a breakdown voltage between the substrate and the control gate. In this manner, at the present, an STI technique of 90-70-nm-width generation or later is not established, and a technique which can easily control an STI filling level and the planarity is demanded.

As a technique that fills the trench with the HDP film, the following technique is disclosed in Jap. Pat. Appln. KOKAI Publication No. 2002-208629. That is, the HDP oxide film is coated on the substrate surface until a trench opening is sealed, and an oxide film near the opening is removed. Thereafter, an HDP oxide film is coated again to fill the trench with the HDP oxide film.

BRIEF SUMMARY OF THE INVENTION

According to a first aspect of the invention, a method of manufacturing a semiconductor device comprises: forming a trench in a semiconductor substrate; forming a first insulating film having a first recessed portion in the trench; forming a coating film so as to fill the first recessed portion therewith; transforming the coating film into a second insulating film; planarizing the second insulating film to expose the first insulating film and the second insulating film; removing at least the second insulating film from the first recessed portion to moderate an aspect ratio for the first recessed portion formed in the trench, thereby forming a second recessed portion therein; and forming a third insulating film on a surface of the semiconductor substrate so as to fill the second recessed portion therewith.

According to a second aspect of the invention, a method of manufacturing a semiconductor device comprises: forming a trench in a semiconductor substrate; forming a first insulating film having a recessed portion in the trench; planarizing an upper side of the first insulating film by a CMP method using a slurry; removing at least the slurry remaining in the recessed portion of the first insulating film by a chemical solution to moderate an aspect ratio for the recessed portion formed in the first insulating film; and forming a second insulating film on a surface of the semiconductor substrate so as to fill the recessed portion therewith.

According to a third aspect of the invention, a semiconductor device includes active regions each being isolated by a trench and having a tunnel insulating film for providing each memory cell and a floating gate provided on the tunnel insulating film, the semiconductor device comprises; a first CVD oxide film filled in the trench to at least a level of the floating gate and a second CVD oxide film provided on the first CVD oxide film.

BRIEF DESCRIPTION OF THE DRAWINGS

FIG. 1 is a plan view typically showing an ordinary flash memory cell structure;

FIG. 2 is a II-II sectional view of FIG. 1;

FIG. 3 is a III-III sectional view of FIG. 1;

DETAILED DESCRIPTION OF THE EMBODIMENTS

Figure 4G:
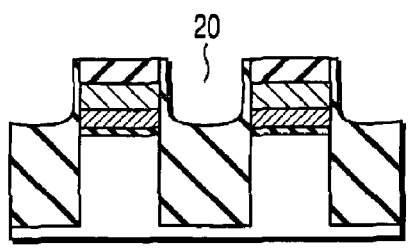
FIGS. 4A to 4O are sectional views schematically showing some of the steps in manufacturing an STI structure according to a first embodiment.

A method of manufacturing a semiconductor device according to a first embodiment will be described with reference to FIGS. 4A to 4O. FIG. 1 is a plan view of a NAND flash memory cell structure using an STI structure known by persons skilled in the art, and FIGS. 2 and 3 are a II-II sectional view and a III-III sectional view of FIG. 1, respectively.

More specifically, commonly, memory cells such as M1 to M8, each having a source/a drain are arranged between select lines S1 and S2 in a matrix of rows and columns, and a word line WL and a bit line BL (omitted) are provided. As shown in FIG. 2, each memory cell includes a tunnel oxide film 11 composed of a silicon oxide film, a floating gate (FG) constituted by two polysilicon films 12 and 13, a control gate (CG) 23 formed through an ONO film 22, and an interlayer insulating film 24, which are formed on a semiconductor substrate 10. The memory cells are electrically isolated from each other by HDP films 18 buried in trenches. As shown in FIG. 3, a source of a select transistor is connected to a wiring layer 29 through a plug 28.

It is difficult that the STI structure is practically formed by a CVD method using the HDP film or the like when filling in the STI having a width of about 90 nm or less is realized at low cost. The STI structure obtained by the filling technique using the coating solution which is attempted in a development stage at the present and the STI structure obtained by the filling technique using the coating method shown in the embodiment are different from each other in the following points.

More specifically, (a) in an STI structure having a width of 90 nm or less, an STI filling material surface is flat and is uniform to a pattern width. (b) A step coverage generated in formation of the filling material is caused to be generated outside and above the STI to perform a planarizing process, and etching back is performed by an etching process until an FG side wall portion in the STI is exposed. (c) At this time, a filling material in at least a region to be etched back has an uniform etching rate in the entire region.

A method of forming an STI structure using such a coating film will be described below. FIGS. 4A to 4L are sectional views of manufacturing steps corresponding to FIG. 1. In particular, the sectional views correspond to a region having a narrow STI width (<90 nm) corresponding to a dotted-line portion in FIG. 2. In this case, the explanation narrows down to the step of forming an STI structure. However, before this process is performed, formation of a sacrificial oxide film, channel ion implantation, removal of the sacrificial oxide film, formation of a gate oxide film, formation of a gate electrode, and formation of a source/drain layers are performed. After the process is carried out, formation of interlayer insulating films, formation of contacts, and formation of wiring layers are performed in the same manner as described above.

A process for manufacturing an STI structure of 90-nm generation will be described below. More specifically, as shown in FIG. 4A, an $SiO_2$ film 11 is formed on a silicon (100) substrate 10 to a thickness of, e.g., about 10 nm, and polycrystalline silicon films 12 and 13 are formed on the resultant structure by an LP-CVD method to a thickness of 150 nm.

As shown in FIGS. 4B and 4C, an $Si_3N_4$ film 14 is formed to a thickness of about 100 nm. The $Si_3N_4$ film 14, the polysilicon films 13 and 12, the $SiO_2$ film 11, and the silicon substrate 10 are processed through a mask layer 15 to form a trench 17 for isolation STI to a depth of, e.g., about 450 nm.

In FIG. 4C, although not shown, the side surfaces of the trench 17 are oxidized by using an ordinary thermal oxidation method to form a thermal oxide film having a thickness of about 3 nm. This is formed to protect an exposed portion at a tunnel oxide film end. A uniform high-quality oxide film may also be formed on the silicon side wall of STI by using radical oxidation or the like independently of the wafer orientation. At this time, the side surface of the $Si_3N_4$ film 14 may be slightly oxidized.

As shown in FIG. 4D, an HDP film 18 of a CVD oxide film is deposited for all the trenches 17 in the wafer by an HDP-CVD method such that a height from the silicon interface under the floating gate to the bottom of the filled HDP is, e.g., 80 nm or more. At this time, in the HDP film 18, the STI opening may be filled to form a void in the trench before the STI trench is completely filled. For this reason, the deposition process must be controlled. Therefore, a first recessed portion 181 which is left in the HDP film 18 without completely filling the trench is formed. As shown in FIG. 4D, the surface of the bottom of the first recessed portion 181 is not always flat, and it may be corrugated or discontinuous. The side surfaces of the first recessed portion 181 are not always vertical in shape. That is, the side surfaces may have step-like shapes or may be overhang.

As shown in FIG. 4E, a coating type solution 19 is deposited on the substrate surface by a coating method to completely fill the structure. For example, the coating film is formed under such a coating condition that the coating film has a thickness of about 600 nm. In this case, for example, the PSZ is deposited by a spin coating method, and a baking step is performed at 150° C. for about 3 minutes in a coating apparatus to vaporize the solvent.

As shown in FIG. 4F, for example, the PSZ film on the $Si_3N_4$ film 14 is selectively removed by a CMP method. However, when the baked PSZ film is soft and beside the PSZ film contains a large amount of nitride, an etching selectivity between the PSZ film and the $Si_3N_4$ film cannot be easily obtained. Therefore, the PSZ film must be cured to some extent. In order to transform the PSZ film 19 into a $SiO_2$ (silica) film 191, a high-temperature heat treatment (curing) is then performed in a water vapor atmosphere before the CMP process. This process can be explained by the following chemical formula:

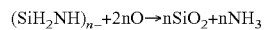

More specifically, the PSZ film reacts with oxygen (O) generated by decomposition of water vapor ($H_2O+O_2$) to produce $SiO_2$ and $NH_3$ (ammonia gas), so that the PSZ film is efficiently transformed into $SiO_2$ (silica). At this time, since an active area is covered with the SiN film 14, it is not oxidized. The chemical reaction described above proceeds from the surface side of the PSZ. It is confirmed that the PSZ film coated on a wafer with a planar structure to a thickness of about 600 nm can be transformed into an $SiO_2$ film by combustion oxidation (BOX oxidation) performed at, e.g., 850° C. in a water vapor atmosphere for about 30 minutes.

Furthermore, a heat treatment is carried out at about 850° C. in an oxidizing atmosphere or an inert gas atmosphere. The HDP film formed as a lower layer is then densified and gases such as $NH_3$, $H_2O$, or the like remaining in the $SiO_2$ film obtained by changing the PSZ film formed as an upper layer are discharged to perform a densifying treatment, whereby the PSZ film is transformed into the $SiO_2$ film 191 having a higher density. At this time, since the active area is covered with the SiN film 14, it is not oxidized. As the densifying process, not only a process performed by an ordinary furnace but also rapid thermal anneal (RTA) may be used. In the RTA, thermal treatment performed at a higher temperature, e.g., 900° C. for about 20 seconds can be used.

In the heating step, the heat treatment cannot be carried out at a higher temperature than 850° C. for a long time. This is because an oxidant is diffused into edges of the tunnel oxide film to form a wedge-shaped oxide film called bird's beak. More specifically, densification of the PSZ film is limited because an operating temperature is limited, and an etching rate which is almost equal to that of a thermal oxide film or an HDP film cannot be realized at present.

As described above, after the PSZ film is transformed into the $SiO_2$ (silica) film, planarization is performed by a CMP method. When a CMP polishing agent (slurry) containing colloidal silica as a base is used, 50 or more can be realized as an etching selectivity between the PSZ film and the SiN film 14.

As shown in FIG. 4G, an etching back process is performed under a condition under which the filled PSZ film can be completely removed. An etching selectivity between the HDP film and the PSZ film is desirably 2.5 or more. At this time, the HDP film on the floating gate side wall may be slightly left due to a difference between the etching rates of the HDP film and the PSZ film, but it may not pose any problem. However, it is difficult to control the level position of STI while removing the remaining HDP film on the floating gate side wall.

That is, since the level position of STI filling at a width of 90 nm is close to the tunnel oxide film 11, the level position is already lower than a desired level position of STI. Furthermore, if protection from the chemical from the tunnel film edges is also considered, STI filling at the desired level position cannot be easily realized by only the HDP film serving as the first layer.

Figure 4H:
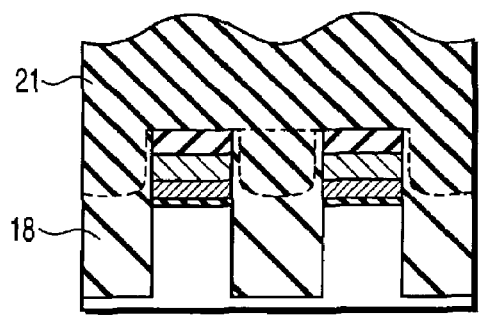
Figure 4I:
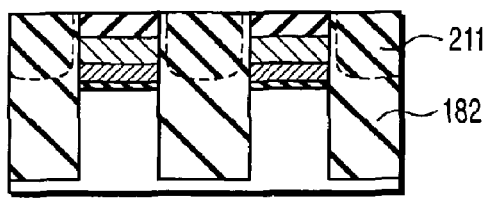

Therefore, as shown in FIG. 4G, after the silica film 191 is removed by wet etching to form a second recessed portion 20, as shown in FIG. 4H, a second HDP film 21 is deposited by an HDP-CVD method. Thereafter, as shown in FIG. 4I, a step coverage on the surface is planarized by a CMP method using the SiN film 14 as a stopper, and then a heat treatment is carried out at about 850° C. in an inert gas atmosphere for one hour. As a result, the HDP films 18 and 21 are densified to be HDP films 182 and 211, respectively, and the STI structure is uniformly filled with these HDP films.

Figure 4J:
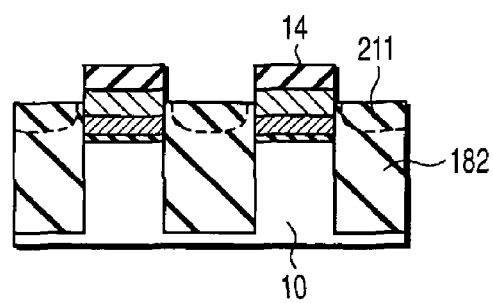
Figure 4K:
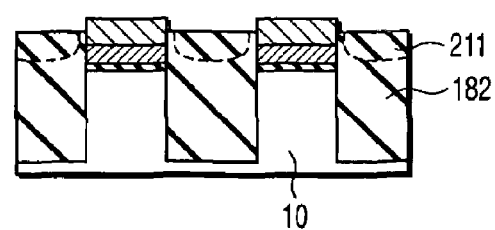

As shown in FIG. 4J, the HDP film 211 is etched back by a hydrogen-fluoride-based (HF) chemical solution to lower the filling level to a desired level. Thereafter, as shown in FIG. 4K, the SiN film 14 is removed by a hot phosphoric acid. As a result, good planarity and preferable level controllability of the surface of the filled HDP film in the STI structure can be provided to realize a desired STI shape which suppresses a variation in a coupling ratio.

Figure 4L:
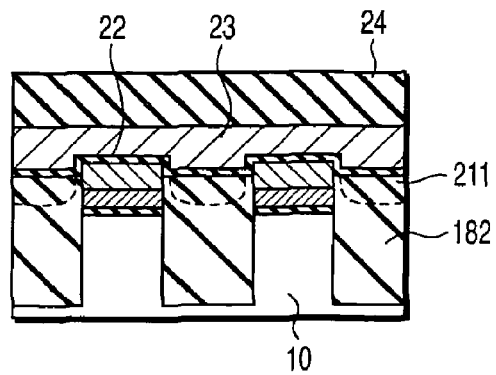

Thereafter, as shown in FIG. 4L, the ONO film 22, control gate electrode 23, and the interlayer insulating film 24 are formed. Although the subsequent steps are not shown, continuously, contacts, wiring layers, a passivation film, pads, and the like are provided to complete an NAND flash memory.

As is apparent from the above explanation, in the first embodiment, as shown in FIGS. 4F and 4G, after planarization is performed by using the PSZ film as a sacrificial film, the PSZ film is selectively removed to make the aspect ratio more moderate than the aspect ratio of the trench 17. When the silica film 191 transformed from the PSZ film is selectively removed, the peripheral HDP film 18, i.e., a part of the HDP film 18 is isotropically etched to increase the opening of the first recessed portion 181, thereby forming the second recessed portion 20. As a result, the aspect ratio is further improved. As shown in FIG. 4H, the second HDP film 21 is formed, and then the surface of the HDP film 21 is planarized again outside and above the STI. Therefore, the STI filling material surface can be planarized with good controllability.

Figure 4M:
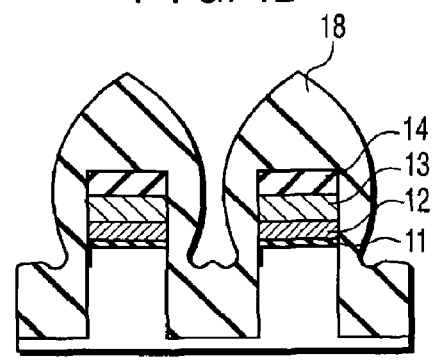

A process for manufacturing an STI structure of 70-nm generation will be described below. In the 90-nm generation described above, the level of the first HDP film on the STI bottom is higher than that of the interface of the tunnel insulating film 11. However, in the STI structure having a width of 70 nm or less, as shown in FIG. 4M, the level of the first HDP film is generally lower than that of the interface of the tunnel oxide film 11.

Furthermore, as described in FIGS. 4D-4F, a coating film 19 is formed and transformed into a silica film 191 by a densifying process, and the silica film 191 is planarized by the CMP method or the like. Thereafter, in order to control the level of the filled film in the STI trench, wet etching is performed.

Figure 4N:
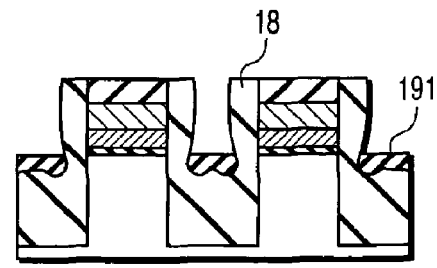
Figure 4O:
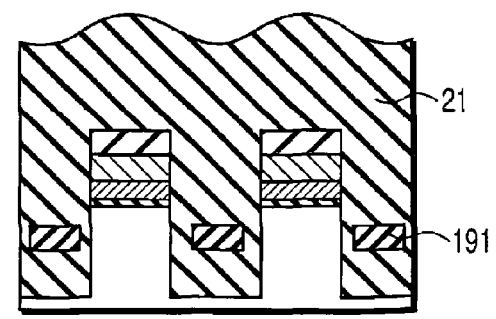

In this case, the PSZ film used in filling may be left without being completely removed in wet etching. More specifically, as shown in FIG. 4N, the silica film 191 transformed from the PSZ film is partially left. Thereafter, as shown in FIG. 4O, the second HDP film 21 is filled in the STI to realize a structure in which the silica film 191 is included in the HDP film.

According to the manufacturing method described above, filling of the HDP film can be realized for an NAND-STI structure of 90-70-nm-width generation or later. A drawback such as a wet etching rate difference caused by using different materials in uncontrollable adjustment of an STI filling level can be eliminated. Therefore, a production yield can be considerably increased.

A second embodiment will be described below. In the first embodiment, the PSZ film is used as the coating type insulating film. However, a polymer material such as a photoresist film or a material which is changed into an inorganic material after a hardening process by curing can be used. The same reference numerals as in the first embodiment denote the same parts in the second embodiment.

More specifically, when a coating film is formed as shown in FIG. 4E, a photoresist film is used for the STI structure of 90-nm generation shown in FIG. 4D as a coating material. After the photoresist film is coated, a baking process at 120° C. for about 30 seconds is performed. In this manner, a solvent remaining in the photoresist film is vaporized to make it possible to harden the film, or the film is polymerized by generating cross-linkage by light irradiation to make it possible to harden the film.

As in FIG. 4F, surface polishing is carried out by a CMP method using an SiN film 14 as a stopper. Thereafter, ashing is performed at 150° C. for 30 seconds in an $O_2$ atmosphere to remove a photoresist film partially filled in the STI. Furthermore, the resultant structure is cleaned by oxidizing acid treatment using a sulfuric acid or the like to remove residue.

Figure 5A:
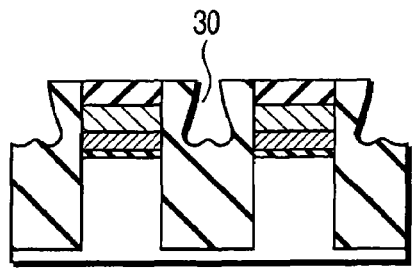
FIGS. 5A to 5D are sectional views schematically showing some of the steps in manufacturing an STI structure according to a second embodiment.
Figure 5B:
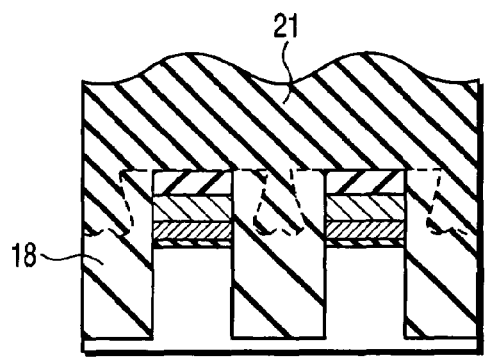

As a result, a structure as shown in FIG. 5A is obtained although an opening 30 is narrower than that in FIG. 4G. When an aspect ratio which is almost equal to that of the opening 30 is used, an HDP film can be filled. For this reason, as shown in FIG. 5B, an HDP film 21 is filled. The subsequent steps are the same as those in the steps subsequent to the step in FIG. 4H in the first embodiment. Finally, a structure shown in FIG. 4L is provided.

Figure 5C:
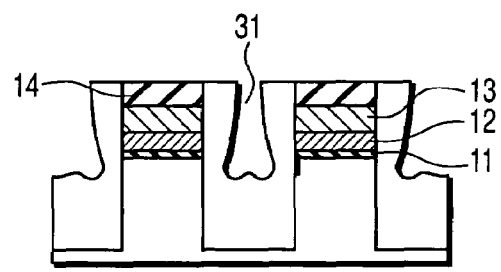

This method can be similarly applied to an STI structure of 70-nm generation. More specifically, as shown in FIGS. 4M and 4N, even though the level position of the STI bottom is lower than the interface of the tunnel insulating film 11, similarly, a material such as a photoresist is coated, and a baking process and a planarizing process by a CMP method are performed. Furthermore, the ashing process and the cleaning process using a sulfuric acid or the like are performed. At this time, since the HDP film 18 is densified by the curing process, dissolution caused by an acid rarely occurs. Therefore, as shown in FIG. 5C, the photoresist film can be completely removed by the acid treatment.

Figure 5D:
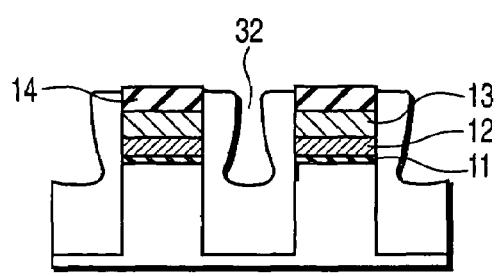

In this case, since the aspect ratio of an opening 31 increases, the second HDP film 21 cannot be easily filled. Therefore, as shown in FIG. 5D, the opening is etched by an RIE method or the like to increase the opening, thereby forming a structure of a bowl-shaped STI bottom. In an opening 32 obtained in this manner, the second HDP film 21 can be filled. For this reason, as in the case shown in FIG. 5B, an STI structure in which the second HDP film 21 is filled can be obtained.

The subsequent steps are the same as the steps subsequent to the step in FIG. 4H in the first embodiment. Finally, a structure shown in FIG. 4L can be formed. A structure in which a coating film is included in the HDP film filled in the STI as shown in the case of FIG. 4O can be similarly obtained. At this time, as the coating film, a film which is changed into an inorganic material free from carbon after the hardening process by curing is desirably used.

As described in the first embodiment or the second embodiment, the PSZ film (silica film) or the inorganic material film included in the HDP film filled in the STI acts as a buffer film which moderates stress in the STI to make it possible to suppress drawbacks such as cracks or film peeling.

A third embodiment will be described below. The same steps as in the first embodiment will be omitted, and only characteristic steps will be described below. The same reference numerals as in the first embodiment denote the same parts in the third embodiment. In FIGS. 4F and 4G, the coated PSZ film 19 is transformed into a silica film 191 by applying a hardening process to the PSZ film 19. Thereafter the silica film 191 is removed by wet etching.

Figure 6A:
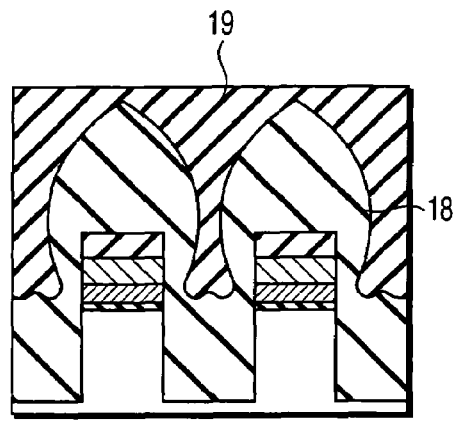
FIGS. 6A to 6C are sectional views schematically showing some of the steps in manufacturing an STI structure according to a third embodiment.
Figure 6B:
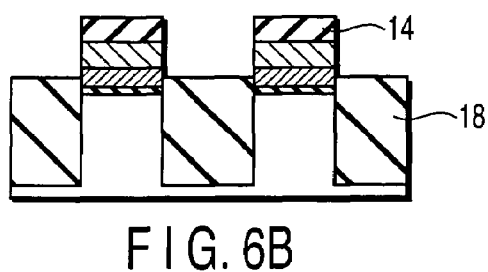
Figure 6C:
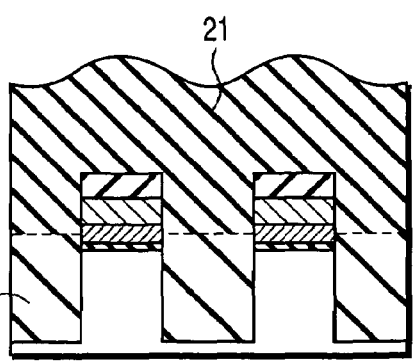

In this embodiment, as shown in FIGS. 6A to 6C, after the PSZ film 19 is deposited and transformed into the silica film 191 by the heat treatment, the silica film 191 is directly etched back by a dry process such as an RIE method or the like to a level position where the silica film 191 is completely removed. Thereafter, as shown in FIG. 4H, a second HDP film 21 is provided. In this manner, the steps of planarization and wet etching in FIGS. 4F and 4G can be omitted.

Figure 7A:
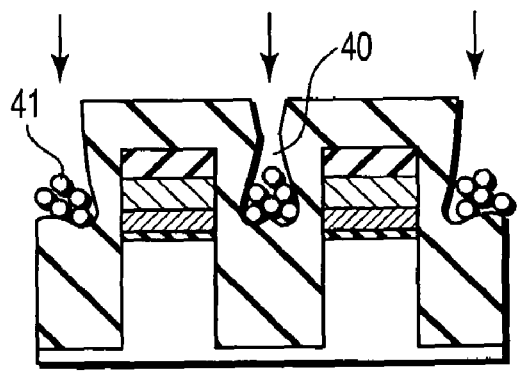
FIGS. 7A to 7D are sectional views schematically showing some of the steps in manufacturing an STI structure according to a fourth embodiment.

Furthermore, a fourth embodiment will be described below. The same steps as in the first embodiment will be omitted, and only characteristic steps will be described below. The same reference numerals as in the first embodiment denote the same parts in the fourth embodiment. More specifically, as shown in FIG. 4D in the first embodiment, after the HDP film 18 is deposited, the CMP step is directly carried out without performing the coating step of the PSZ film or the like as it is as shown in FIG. 7A in the fourth embodiment.

At this time, as a CMP polishing agent (slurry), a colloidal-silica-based agent containing a small amount of additive such as sodium (Na) is selected. When this CMP process is performed, as shown in FIG. 7A, a slurry 41 is inserted into an incomplete filling trench 40 of the HDP film and remains therein.

Figure 7B:
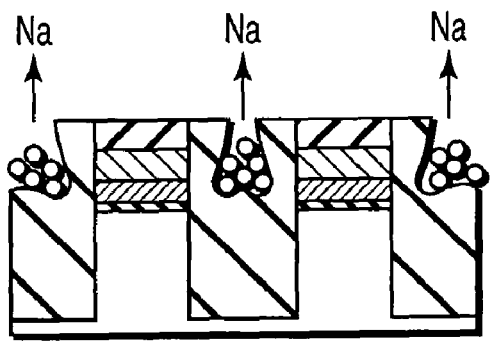
Figure 7C:
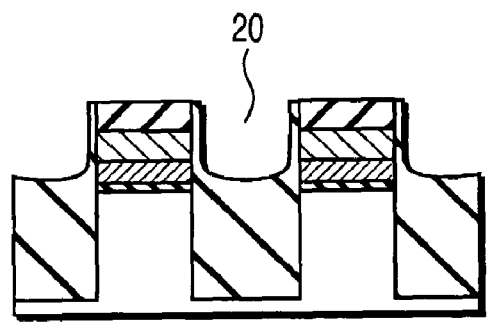

However, since the slurry 41 is provided by single particles containing hydrated silica as a main component, it can be easily dissolved by a buffered hydrofluoric acid. At this time, a ratio of the etching rate of the slurry 41 to the etching rate of the HDP film around the trench is about 5 or more because the slurry is granular and has a wide etching area and because the film quality of the HDP film is closer to the film quality of a thermal oxide film than that of the slurry. In addition, since a small amount of additive is selected as the additive such as Na, as shown in FIG. 7B, the additive can be removed by water washing. As a result, a structure having a second recessed portion 20 as shown in FIG. 7C is provided. The resultant aspect ratio is more moderate than the aspect ratio of the recessed portion in the HDP film. Since the subsequent steps are the same as those in the first embodiment, a desired STI structure as shown in FIG. 4K is obtained.

Figure 7D:
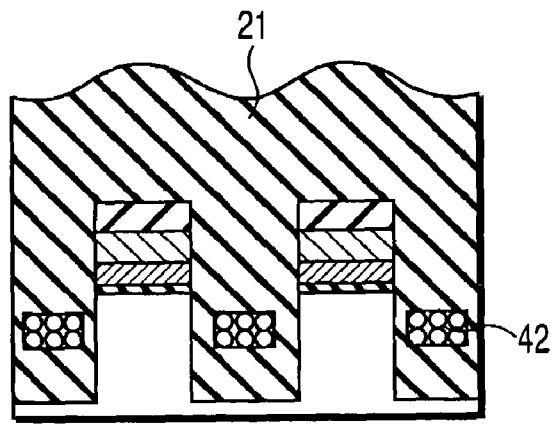

A case in which the slurry 41 is allowed to remain in the incomplete trench 40 of the HDP film will be described below. More specifically, after the additive in the slurry is removed by an appropriate acid or water washing, as shown in FIG. 4H, a second HDP film 21 is formed on the structure in which the HDP film and the residue are filled. In a process in which subsequent annealing to densify these oxide films is performed, the particles of the slurry residue are melted to form a porous region. As a result, as shown in FIG. 7D, like the silica film in FIG. 4O, a filling structure of the HDP film 21 including a crystallized porous film 42 is obtained.

The characteristic features of the structure described above will be described below. More specifically, when a PSZ coating film having a large thermal contraction is used, for example, when a PSZ film remains as a film included in the STI, the PSZ film is not a porous film after a heat treatment to generate tensile stress to the silicon substrate and the floating gate portion which are adjacent to the PSZ. As a result, dislocation and point defects are caused in the silicon film. In the worst case, the filled film in the STI may be cleaved in the vertical direction. In the first embodiment (FIG. 4O), the cleavage does not occur because the region of the PSZ film (silica film) is narrow. However, with scaling down of the STI structure, the occupied area of the coating film in the STI increases to make these problems serious.

However, the porous region formed by using the slurry as a material acts as a buffer film which moderates the internal stress in the STI to make it possible to suppress drawbacks such as defects and cleavage. The coating solution is a coating solution for forming a silica-based coating film or the like, and is not limited to PSZ.

The aspect of the embodiments are as follows.

(1) The coating solution is a coating solution for forming a silica-based coating film or the like, and is not limited to PSZ.

(2) Heat treatment is carried out in an oxidizing atmosphere or an inert gas atmosphere to perform a process of densifying the HDP film formed as the lower layer and a process of discharging $NH_3$, $H_2O$, and the like remaining in the $SiO_2$ film obtained by changing the PSZ film formed as the upper layer, so that these films are changed into $SiO_2$ films having higher densities.

(3) After the coating film is transformed into the second insulating film, the second insulating film is etched back by an RIE method. Thereafter, a second HDP film is formed.

(4) As the coating film, a material such as a photoresist film which is changed into an inorganic material after a hardening process by curing is coated and then applied with a baking process.

(5) The filled photoresist film is removed by an ashing process.

(6) The level of the planarized surface is higher than the level position of the tunnel oxide film.

(7) In 70-nm-width generation or later, the level of the polanarized surface is lower than the level position of the tunnel oxide film.

(8) The first and second HDP films are formed and applied with heat treatment in an inert gas atmosphere to densify the HDP films.

(9) The second HDP film is filled in the STI such that the silica film is partially left, thereby obtaining a structure in which the silica film is included in the HDP film.

(10) After additive in the slurry is removed by an acid or water washing, the second HDP film is formed on a structure in which the HDP film and the residue are buried. In the subsequent heat treatment process to densify these oxide films, a filling structure of the HDP film including a porous film which is formed such that the particles of slurry residue are melted and then crystallized is obtained.

(11) At least a part of the porous inorganic film included in the HDP film acts as a buffer film which moderates the internal stress of the STI.

(12) Water washing is performed before the slurry remaining in the recessed portion is removed by a chemical solution to remove water-soluble impurities.

(13) The porous film is formed by melting the particles of the slurry residue.

(14) The method described above is applied to STI filling of a flash memory or a CMOS logic product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a first silicon oxide film on a semiconductor substrate;
    forming a polycrystalline silicon film on the first silicon oxide film;
    forming a silicon nitride film on the polycrystalline silicon film;
    etching the silicon nitride film, the polycrystalline silicon film, the first silicon oxide film, and the semiconductor substrate to form a trench;
    forming a first high-density plasma (HDP) film in the trench, the first HDP film being formed along side surfaces of the first silicon oxide film, the polycrystalline silicon film and the silicon nitride film, and being formed on an upper surface of the silicon nitride film so that a first recess is formed over the trench;
    forming a coating film so as to fill the first recess therewith;
    transforming the coating film into a second silicon oxide film;
    planarizing the first HDP film and the second silicon oxide film using the silicon nitride film as a stopper;
    removing the first HDP film formed along the side surfaces of the first silicon oxide film, polycrystalline silicon film and the silicon nitride film while removing the second silicon oxide film so that a second recess is formed over the trench, a width of an opening of the second recess is larger than a width of an opening of the first recess;
    forming a second HDP film in the second recess and on the silicon nitride film;
    planarizing the second HDP film using the silicon nitride film as a stopper;
    etching the second HDP film to expose the side surface of the polycrystalline silicon film;
    removing the silicon nitride film to expose an upper surface of the polycrystalline silicon film;
    forming an insulating film on the exposed polycrystalline silicon film; and
    forming a control gate on the insulating film.

2. The method according to claim 1, wherein the coating film is comprised of a PSZ film.

3. The method according to claim 1, wherein the coating film is heat-treated at a high temperature in a water vapor atmosphere to transform the coating film into an $SiO_2$ film (silica film).

4. The method according to claim 1, wherein the second silicon oxide film and the first silicon oxide film formed on the side surfaces of the first silicon oxide film, polycrystalline silicon film and the silicon nitride film are removed by a wet etching method.

5. The method according to claim 1, wherein the second HDP film is removed by hydrogen-fluoride-based (HF) chemical solution.

6. The method according to claim 1, wherein the insulating film includes a pair of silicon oxide films and a silicon nitride film formed between the silicon oxide films.

* * * * *